United States Patent [19]
Asai et al.

[11] Patent Number: 5,367,180
[45] Date of Patent: Nov. 22, 1994

[54] THIN-FILM SEMICONDUCTOR DEVICE WITH FIELD PLATE

[75] Inventors: Ichiro Asai; Takao Tomono; Takeshi Nakamura, all of Ebina, Japan

[73] Assignee: Fuji Xerox Co., Ltd., Tokyo, Japan

[21] Appl. No.: 46,397

[22] Filed: Apr. 9, 1993

Related U.S. Application Data

[63] Continuation of Ser. No. 739,529, Aug. 2, 1991, abandoned.

[30] Foreign Application Priority Data

Aug. 10, 1990 [JP] Japan ................................ 2-210421
Jul. 18, 1991 [JP] Japan ................................ 3-202321

[51] Int. Cl.$^5$ ...................... H01L 29/78; H01L 27/12
[52] U.S. Cl. ............................ 257/66; 257/59; 257/488
[58] Field of Search ............. 357/23.7, 53; 257/59, 257/66, 488

[56] References Cited

U.S. PATENT DOCUMENTS

| | | | |
|---|---|---|---|
| 4,797,108 | 1/1989 | Crowther | 257/59 |
| 4,885,616 | 12/1989 | Ohta | 357/23.7 |
| 4,958,205 | 9/1990 | Takeda et al. | 357/23.7 |
| 5,017,984 | 5/1991 | Tanaka | 257/59 |

OTHER PUBLICATIONS

Ratnam, *Electronics Letts* Apr. 13, 1989 vol. 25 No. 8 pp. 537-538 "Noval Silicon-on Insulator . . . Circuits".
Hack, M. et al., "Physics of Novel Amorphous Silicon High-Voltage Transistor", Mat. Res. Soc. Symp. Proc., vol. 95, pp. 457-462.
Martin, R. A. et al., "Enhancement of Performance and Reliability of Amorphous Silicon High Voltage Thin Film Transistors by use of Field Plates", IEEE, IEDM 89-341, pp. 13.2.1-13.2.4.

*Primary Examiner*—Jerome Jackson
*Attorney, Agent, or Firm*—Finnegan, Henderson, Farabow, Garrett & Dunner

[57] ABSTRACT

The invention is based on a thin-film semiconductor FET device. A field plate electrode for producing an electric field is formed on a channel-protecting film above the end of the gate electrode that is on the side of an offset region. Stable transistor characteristics can be maintained for a long time with the field plate electrode voltage set to a low value. The drain electrode is coated with a film of an anticorrosion metal. Where an integrated circuit with a high device density is fabricated from semiconductor devices of this construction, the drain electrodes are effectively prevented from being corroded.

3 Claims, 12 Drawing Sheets

THIN-FILM SEMICONDUCTOR DEVICE WITH FIELD PLATE

This application is a continuation, of application Ser. No. 07/379,529 filed Aug. 2, 1991, now abandoned.

FIELD OF THE INVENTION

The present invention relates to a thin-film field-effect-transistor semiconductor device used for the head of an electrostatic plotter or the like and, more particularly, to improvements in a thin-film semiconductor device which withstands high voltages and to which a high voltage is applied in operation.

BACKGROUND OF THE INVENTION

A known thin-film semiconductor device of this kind is shown in FIGS. 12 and 13, and consists mainly of a glass substrate a, a gate electrode G formed on the substrate a, a gate-insulating film b that covers the gate electrode G, a silicon semiconductor layer c formed on the gate-insulating film b, a channel-protecting film d for protecting the silicon semiconductor layer c, Ohmic contact layers e formed at both ends of the semiconductor layer c, a source electrode S and a drain electrode D deposited on the layers e, respectively, and conductive interconnects f connected with the source and drain electrodes S, D. The conductive interconnects f are made of aluminum (Al) or other similar material. The silicon semiconductor layer c is made of amorphous silicon (a-Si) and forms an active layer. The source and drain electrodes S, D are made of chromium or other material.

In this thin-film semiconductor device, a drain voltage $V_D$ is applied between the source electrode S and the drain electrode D. Also, a gate voltage $V_G$ is applied to the gate electrode G. Thus, a channel is formed in the silicon semiconductor layer c that is an active layer, and the device is turned on, permitting a drain current $I_D$ to flow. As the gate voltage $V_G$ is decreased, the channel ceases to be formed, so that the device is turned off. The device is typically incorporated in the head of an electrostatic plotter.

A high voltage must, therefore, be applied to the drain electrode D of this kind of thin-film semiconductor device, depending on the characteristics of the apparatus incorporating this semiconductor device. In the foregoing case, an electric discharge tends to take place between the source electrode S and the drain electrode D and between the gate electrode G and the drain electrode D, thus destroying the gate-insulating film b or the silicon semiconductor layer c.

Therefore, a thin-film semiconductor device designed to withstand high voltages has been developed. Specifically, as shown in FIGS. 14 and 15, in this semiconductor device, the gate electrode G is located close to the source electrode S that is at a low potential. An offset region g which does not proximately oppose the gate electrode G is formed in the silicon semiconductor layer c between the source electrode S and the drain electrode D. The gate electrode G is spaced relatively far from the drain electrode D which is at a high potential. In this way, destruction due to electric discharge is prevented.

In this thin-film semiconductor device designed to withstand high voltages, when the gate voltage $V_G$ is applied, a channel is formed in the silicon semiconductor layer c at a location opposite to the gate electrode G as shown in FIG. 15. Thereafter, carriers flow from the low potential source electrode S towards the interface with the gate-insulating film b. At the same time, the high potential drain electrode D sets up a strong electric field inside the offset region g. The carriers are pulled toward this electric field after passing through the channel, and then the carriers cross the potential barrier in the silicon semiconductor layer c and flow along the interface with a channel-protecting film d similar to the channel-protecting film d already described in connection with FIGS. 12 and 13. In this manner, this device serves the same function as the previously described semiconductor device.

Indeed this thin-film semiconductor device designed to withstand high voltages is excellent in that the silicon semiconductor layer c is prevented from being destroyed by electric discharge, but if an inverter circuit as shown in FIG. 16 is built using this semiconductor device, then the lower value $V_{OL}$ assumed by the output voltage $V_D$ from this inverter tends to become high. Hence, the characteristic of the inverter deteriorates.

More specifically, in the inverter circuit shown in FIG. 16, it is assumed that $V_S$ applied to the thin-film semiconductor device h designed to withstand high voltages is set to 0 V and that $V_{HH}$ applied to the drain is set to 500 V. It is also assumed that the gate input is driven by another transistor i. When the signal applied to the gate from the transistor i is at logic level 0, i.e., the gate voltage $V_G$ is off, then the thin-film semiconductor device h designed to withstand high voltages serves as a high resistor of about 10 GΩ and so the intended high output voltage $V_D$ of about 450 V is obtained from the inverter. On the other hand, when the signal applied to the gate from the transistor i is at logic level 1, i.e., the gate voltage $V_G$ is on, then the semiconductor device h conducts. At this time, the resistance is approximately 0.1 GΩ. Theoretically, the output voltage $V_D$ from the inverter is a low voltage of about 10 V. In practice, however, the semiconductor device does not fully conduct. Consequently, the lower output voltage $V_{OL}$ is higher than the above-described value.

Recently, a high voltage-withstanding thin-film semiconductor device free of this disadvantage has been developed. As shown in FIGS. 17 and 18, a field plate electrode j is formed to improve the conduction in the offset region g. In particular, this semiconductor device has the offset region g. The field plate electrode j is used to produce an electric field, is formed on an interlayer insulating film k above the end of the gate electrode G, and is located on the side of the offset region g. The energy of the electric field generated by the field plate electrode j is supplied to carriers passed through the channel so that the carriers may cross the potential barrier more easily to thereby improve conduction. The barrier is produced in the channel layer above the end of the gate electrode G that is located on the side of the offset region g. In consequence, an output voltage higher than the desired value is obtained. A device-protecting layer m, covers the whole device and is made of polyimide resin or the like.

In this, improved high-voltage withstanding semiconductor device, the field plate electrode j is formed on the interlayer insulating film k above the end of the gate electrode G that is located on the side of the offset region g as described above, into account the resistance to the high voltage applied to the field plate electrode j. This structure improves conduction, resulting in a lower output voltage $V_{OL}$. The electrical insulation between the field plate electrode j and the silicon semiconductor layer c is provided by both channel-protecting film d and interlayer insulating film k and, therefore, if a small number of pinholes or cracks exist in the channel-protecting film d that is made of, for example, $SiN_x$, sufficient resistance to high voltages can be secured.

On the other hand, the field plate electrode j is located remotely from the silicon semiconductor layer c, because the interlayer insulating film k and the channel-protecting film d are interposed between them. Therefore, the carriers passing through the channel cannot easily receive the energy from the electric field developed by the field plate electrode j. For example, in order to obtain a lower output voltage $V_{OL}$ of 10 V it is necessary to set the field plate electrode voltage $V_{FP}$ to a high value on the order of 100 V as illustrated by conventional example ② shown in graph of FIG. 5. However, by increasing $V_{FP}$ the electric power consumed in the device is increased accordingly. In the thin-film, improved high-voltage withstanding manner, this semiconductor device suffers from a disadvantage.

Where the interlayer insulating film k is made of an organic material such as polyimide resin, the energy of the electric field developed by the field plate electrode j may not readily act on the carriers described above because of the polarization of the polyimide molecules themselves or the polarization of impurity ions or water molecules present in the polyimide resin. The value of the field plate electrode voltage $V_{FP}$ must, therefore, be increased accordingly. In addition, the polarization of the polyimide molecules themselves often varies with time. Concomitantly, the effective value of the field plate electrode voltage $V_{FP}$ changes. As a result, the lower output voltage $V_{OL}$ varies with time.

Where the interlayer insulating film k is made of an inorganic material such as $SiO_x$ or $SiN_x$, the lower output voltage $V_{OL}$ varies less with time under the presence of polarization compared with the case in which the film k is made of an organic material such as polyimide resin. However, increased stress occurs between the channel-protecting film d and the insulating film k. For this reason, the effective value of the field plate electrode voltage $V_{FP}$ is liable to change. Hence, the lower output voltage $V_{OL}$ still varies with time.

If thin-film, improved, high-voltage withstanding semiconductor devices of this construction are integrated at a device density exceeding a certain value, then field plate electrodes j will be spaced quite close to adjacent source electrodes. Therefore, given the potential for short circuits between these electrodes, and production yield, and patterning accuracy, in addition to problems preventing intersections on the layout, conventional wisdom dictates that placing the aluminum interconnects f overlying the source electrode S and the drain electrode D together with the field plate electrode j is undesirable.

Under these circumstances, the conventional structure is that the source electrode S and the drain electrode D are brought out close to the thin-film semiconductor device designed to withstand high voltages. The aluminum interconnects f are disposed on the brought out electrodes S and D somewhat remote from the field plate electrode j. An apparatus in which the thin-film semiconductor devices designed to withstand high voltages are incorporated with a large device density shows good characteristics and production yield, but the drain electrode D made of chromium is eroded after prolonged operation of the apparatus.

SUMMARY OF THE INVENTION

It is an object of the present invention to provide a thin-film semiconductor device which withstands high voltages, permits its field plate electrode voltage $V_{FP}$ to be set to a low value, enables variations in the effective value of the field plate electrode voltage $V_{FP}$ to be suppressed, and can form an inverter circuit whose lower output voltage $V_{OL}$ does not vary with time to the extent of conventional devices.

It is another object of the invention to provide a thin-film semiconductor device which withstands high voltages and can be used in the manufacture of an integrated circuit having a high device density and including drain electrodes that are effectively prevented from being corroded.

The first-mentioned object is achieved by a semiconductor device comprising an insulating substrate, a gate electrode formed on the substrate, a gate-insulating film that covers the gate electrode, a semiconductor layer formed on the gate-insulating film, a channel-protecting film that covers the semiconductor layer, a source electrode connected with the semiconductor layer, a drain electrode connected with the semiconductor layer, an offset region formed in the semiconductor layer between the source electrode and the drain electrode, and a field plate electrode for producing an electric field. The gate electrode is located close to the source electrode to permit the formation of the offset region that is not opposite to the gate electrode. The field plate electrode is formed on the channel-protecting film above the end of the gate electrode that is located on the side of the offset region. This device can be incorporated into an inverter circuit. Of course, this device can also be used in other applications.

Since the field plate electrode is formed on the channel-protecting region above the end of the gate electrode located on the side of the offset region, the field plate electrode is close to the semiconductor layer. Therefore, carriers easily receive the energy of the electric field created by the field plate electrode. The set value of the field plate electrode voltage $V_{FP}$ can be reduced accordingly.

Less stress is produced between the channel-protecting layer and the underlying semiconductor layer than the stress produced when an interlayer insulating film is employed. Furthermore, the channel-protecting film itself is less susceptible to polarization. Also, less impurity ions are introduced into this protecting film. Consequently, the effective value of the field plate electrode voltage $V_{FP}$ varies only a little with time. Hence, the characteristics of the transistor can be maintained stably for a long time with the field plate electrode voltage $V_{FP}$ set to a low value.

The corrosion of drain electrodes in an integrated circuit has been analyzed in the following manner. The source and drain electrodes are normally made of chromium (Cr), because it can be easily etched away and because it permits the silicide layer formed between these electrodes and the underlying layer, for example, an n+ amorphous silicon layer to be readily removed. Another reason for wide acceptance of chromium is that atoms are not diffused into the n+ amorphous silicon layer; otherwise a high resistance would be created. The film protecting the source and drain electrodes is generally made of polyimide that is an organic material rather than of an inorganic film which is superior in moisture resistance to the organic film, for the following reasons: It is easy to form. The resulting stress affects the underlying layer to a lesser degree. The polyimide film itself withstands high voltages. Where it is used as an interlayer film, it exhibits a good flatness. Hence, it yields a high production yield.

It is estimated that when a high voltage is applied to the drain electrode D of the structure described above, entering moisture oxidizes the drain electrode, or the anode, made of chromium, since the protecting film made of polyimide easily passes moisture. Then, the resulting oxide of the chromium melts away into the environment, so that the anode is corroded by anodic corrosion. Of course, the source electrode S serving as the cathode and made of chromium is not corroded.

Since the field plate electrode is located close to the source electrode, they are very close to each other, but the drain electrode is less close to the field plate electrode. Therefore, if an integrated circuit is built from devices of this construction, a protective film made of aluminum (Al) can be coated on the drain electrode D forming the anode as well as on the field plate electrode.

The second object described is achieved by a thin-film semiconductor device comprising an insulating substrate, a gate electrode formed on this substrate, a gate-insulating film that covers the gate electrode, a semiconductor layer formed on this gate electrode, a channel-protecting film that covers the semiconductor layer, a source electrode connected with the semiconductor layer, a drain electrode connected with the semiconductor layer, an offset region formed in the semiconductor layer between the source and drain electrodes, and a field plate electrode for producing an electric field. The gate electrode is located close to the source electrode to permit the formation of the offset region that is not opposite to the gate electrode. The field plate electrode is formed either on the channel-protecting film or on an interlayer insulating film formed on the protecting film. The field plate electrode is located above the end of the gate electrode that is on the side of the offset region. The drain electrode made of chromium is coated with a film of an anticorrosion metal such as aluminum. Therefore, if water enters, the drain electrode is not directly exposed to the moisture, because the drain electrode of Cr is coated with the film of the anticorrosion metal such as Al. The electrical current flowing from the drain electrode to the source electrode passes through the anticorrosion metal film of a low specific resistance. As a result, the drain electrode made of chromium is not oxidized. Also, it is unlikely that oxide film of the drain electrode will melt away.

Other objects and features of the invention will appear in the course of the description thereof which follows.

DETAILED DESCRIPTION OF THE INVENTION

Figure 1A:
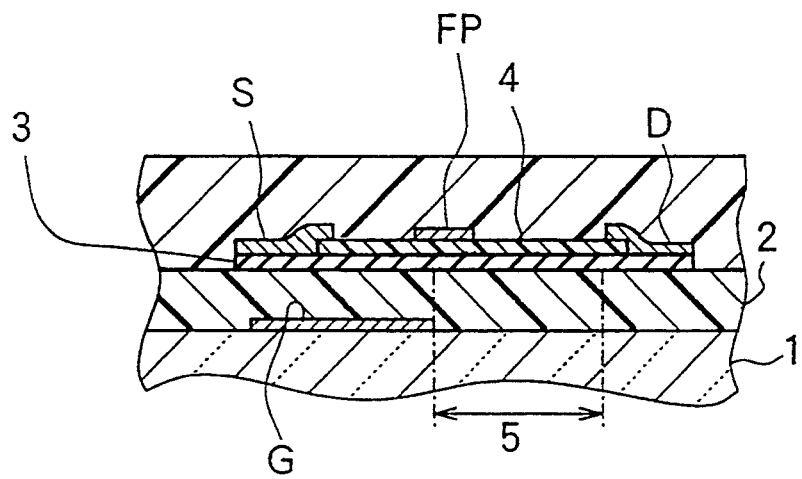
FIG. 1(a) is a schematic cross section of a thin-film semiconductor device according to the invention.

Referring to FIG. 1(a), there is shown a first exemplary embodiment, thin-film semiconductor device embodying the concept of the present invention. This device has an insulating substrate 1 on which a gate electrode G is formed. This gate electrode G is coated with a gate-insulating film 2. A semiconductor layer 3 is formed on the gate-insulating film 2. A channel-protecting protecting film 4 is coated on the semiconductor layer 3. A source electrode S and a drain electrode D are connected with the semiconductor layer 3. The gate electrode G is located close to the source electrode S. An offset region 5 that is not disposed opposite to the gate electrode G is formed in the semiconductor layer 3 between the source electrode S and the drain electrode D. A field plate electrode FP for producing an electric field is formed on the channel-protecting film 4 above the end of the gate electrode G that is on the side of the offset region 5.

The insulating substrate 1 is made of glass, quartz, ceramic, or other material. The semiconductor layer 3 formed on the substrate 1 is typified by a silicon semiconductor layer. This silicon semiconductor layer consists of intrinsic amorphous silicon in which impurity ions may or may not be implanted or of polysilicon.

The offset region 5 is formed between the drain electrode D and the gate electrode G which are at high potentials. The length of this offset region 5 is appropriately set, depending on the characteristics of the semiconductor layer 3 and also on the required voltage resistance.

The position of the field plate electrode FP formed on the channel-protecting film 4 is so determined that the energy of the electric field is efficiently supplied to the carriers passed through the channel, whereby the carriers can easily cross the potential barrier. It is necessary that the field plate electrode FP register with the gate electrode G at least over a length on the order of 1 μm.

Since the field plate electrode FP is formed on the channel-protecting film 4 above the end of the gate electrode G located on the side of the offset region 5, the field plate electrode FP is spaced close to the semiconductor layer 3. Therefore, carriers easily receive the energy of the electric field generated by the field plate electrode FP. The set value of the field plate electrode voltage $V_{FP}$ is lowered accordingly.

Less stress is produced between the channel-protecting film 4 and the underlying semiconductor layer 3 than the stress created where an interlayer insulating film is formed. In addition, the protecting film 4 itself is less polarized. Also, less impurity ions are introduced in this film. In consequence, the effective value of the field plate electrode voltage $V_{FP}$ varies less with time. Hence, the characteristics of the transistor are maintained stably for a long time with the field plate electrode voltage $V_{FP}$ set to a low value.

Figure 1B:
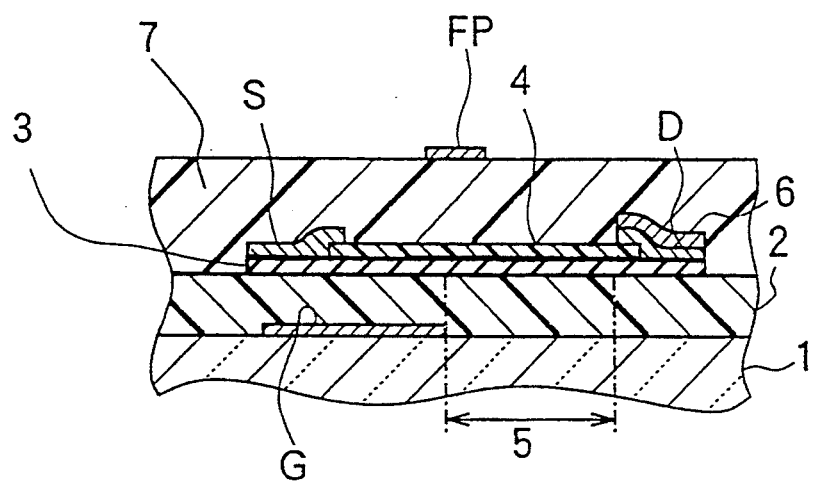
FIG. 1(b) is a schematic cross section of another thin-film semiconductor device according to the invention.

Referring next to FIG. 1(b), there is shown another exemplary embodiment thin-film semiconductor device according to the present invention. This device is similar to the device shown in FIG. 1(a) except that the field plate electrode FP for producing an electric field is formed either on the channel-protecting film 4 or on an interlayer semiconductor layer 7 formed on the protecting film 4, and that the drain electrode D is coated with a film 6 of an anticorrosion metal. The material of the source electrode S and the drain electrode D is not limited to chromium (Cr). These electrodes can also be made of molybdenum (Mo), nickel (Ni), or any of various other alloys.

The material of the anticorrosion metal film 6 is not restricted to aluminum (Al). The film 6 can also consist of other metal such as tantalum (Ta), titanium (Ti), or an aluminum alloy. The anticorrosion metal film 6 is not required to be as thick as conductive interconnects; rather it is only necessary that the film 6 be thick enough to prevent corrosion of the drain electrode D. However, in order not to increase the number of the steps of the process, it is desired to fabricate the film 6 from aluminum, because the field plate electrode FP and the anticorrosion metal film 6 are formed simultaneously. Where importance is attached to the number of steps, this aluminum film is made equal in thickness to the field plate electrode FP.

If the aluminum film is directly connected with the n+ amorphous silicon layer, the drain electrode D will not be eroded. However, aluminum atoms diffuse into the n+ amorphous silicon layer, increasing the resistance of the drain electrode. This produces undesirable results. Taking account of the costs and the production yield, therefore, a material that matches well the process such as chromium is used in a conventional manner. Furthermore, the aluminum layer that is not corroded is formed simultaneously with the field plate electrode FP. The chromium layer is coated with this aluminum layer.

Because the drain electrode D of chromium is coated with the anticorrosion metal film 6 made of Al, if water enters the device, the drain electrode D is prevented from being directly exposed to the moisture. The electrical current flowing from the drain electrode D to the source electrode S passes through the anticorrosion metal film 6 of a low specific resistance. The drain electrode D is prevented from being oxidized, or a film of oxide of the drain electrode D is prevented from melting away. Therefore, the materials which provide good matching to the prior art processes and are used in the drain electrode D and the protecting film, such as Cr and polyimide, can also be used in the invention. Their excellent electrical characteristics are utilized in the invention. A reliable semiconductor device which withstands high voltages and has a high device density can be fabricated from devices of this construction without deteriorating the production yield.

Figure 2:
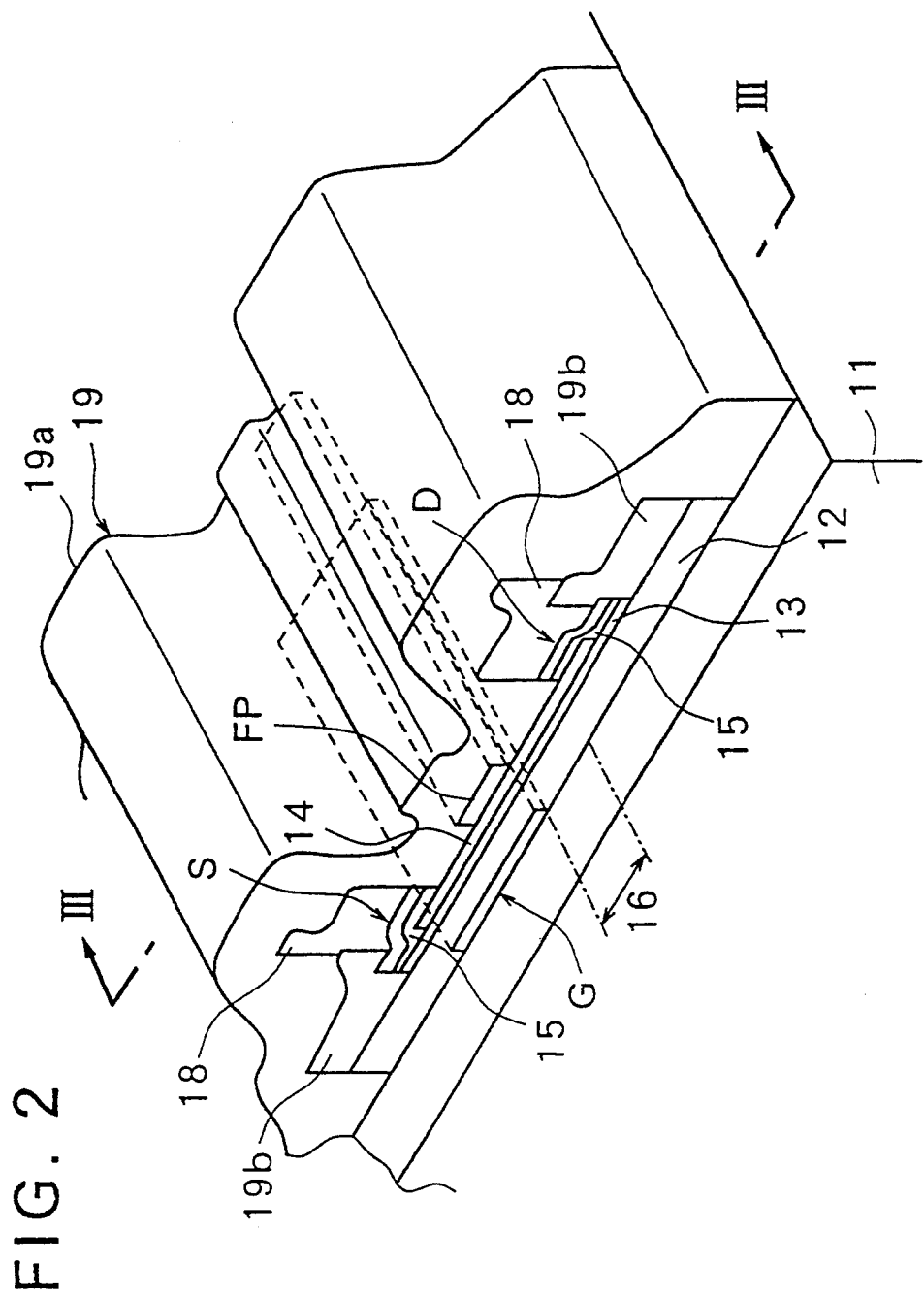
FIG. 2 is a schematic perspective view of a further thin-film semiconductor device according to the invention.
Figure 3:
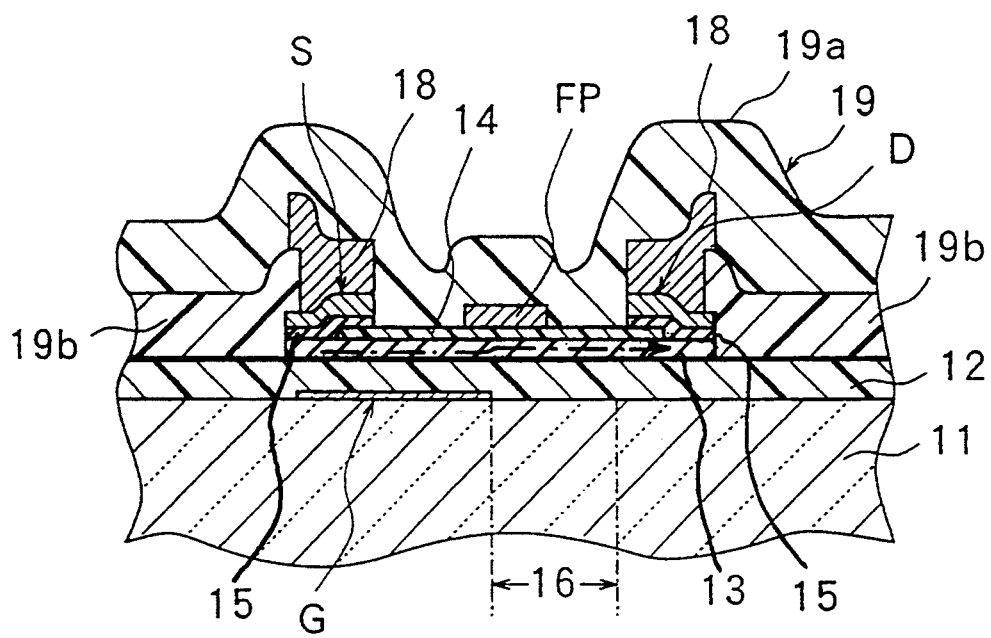
FIG. 3 is a cross-sectional view taken on line III—III of FIG. 2.

Referring to FIGS. 2 and 3, there is shown a further thin-film semiconductor device according to the invention. This device has a glass substrate 11 on which a gate electrode G of chromium is formed. The gate electrode G is coated with a gate-insulating film 12 made of $SiN_x$ and having a thickness of 3000 Å. A semiconductor layer 13 made of amorphous silicon and having a thickness of 500 Å is grown on the gate-insulating film 12. A channels-protecting layer 14 made of $SiN_x$ and having a thickness of 2000 Å is formed on the semiconductor layer 13 except for the vicinities of both ends of the layer 13. Ohmic contact layers 15 are made of n+ amorphous silicon and located at both ends of the semiconductor layer 13. A source electrode S and a drain electrode D both of which are made of chromium are formed on the Ohmic contact layers 15. The gate electrode G is located close to the source electrode S. An offset region 16 that is not disposed opposite to the gate electrode G is formed in the semiconductor layer 13 between the source electrode S and the drain electrode D. A field plate electrode FP made of aluminum and having a thickness of 8000 Å is formed on the channel-protecting film 14 above the end of the gate electrode G that is on the side of the offset region 16. Conductive interconnects 18 made of aluminum are connected with the source electrode S and with the drain electrode D. The body of this device is totally coated with a device-protecting film 19 made of polyimide resin and having a thickness of 1.1 μm. in this example, the device-protecting film 19 consists of two layers 19a and 19b. Interlayer insulating films (not shown) made of polyimide resin are used to provide insulation between the electrodes and the interconnects.

In this thin-film semiconductor device, a drain voltage $V_D$ is applied between the source electrode S and the drain electrode D, and a gate voltage $V_G$ is impressed on the gate electrode G, in the same way as in the prior art semiconductor device. As a result, a channel is formed in the silicon semiconductor layer 13 in the location opposite to the gate electrode G. The application of the drain voltage $V_D$ induces a strong electric field in the offset region 16.

Carriers supplied from the source electrode S that is at a low potential pass through the channel formed in the semiconductor layer 13 on the side of the boundary with the gate-insulating film 12, and then the carriers are pulled by the drain voltage $V_D$, after which the carriers cross the interface between the semiconductor layer 13 and the channel-protecting layer 14 and flow into the drain electrode D. Thus, a drain current $I_D$ flows between the source electrode S and the drain electrode D. It follows that the device conducts. As the gate voltage $V_G$ is reduced, the channel is no longer created in the semiconductor layer 13 and so the drain current $I_D$ ceases. Hence, the device does not conduct, i.e., is turned off.

In the present example, the field plate electrode FP overlies the channel-protecting film 14. The energy of the electric field set up by the field plate electrode FP is supplied to the carriers passed through the channel. They cross the potential barrier with greater ease, the barrier being produced in the channel layer above the end of the gate electrode G that is located on the side of the offset region 16. Therefore, the conduction of the device is improved greatly. The result is that a stable output voltage is obtained.

Because the field plate electrode FP is formed on the channel-protecting film 14, and because the field plate electrode FP is disposed close to the silicon semiconductor layer 13, the energy of the electric field produced by the field plate electrode FP more easily acts on the carrier flowing through the semiconductor layer 13 than in the prior art semiconductor device. The set value of the field plate electrode voltage $V_{FP}$ applied to the field plate electrode FP can be reduced accordingly. The channel-protecting film 14 sufficiently withstands voltages in the neighborhood of this value. Also, use of voltages in the neighborhood of this value results in a satisfactory production yield.

Additionally, the stress produced between the channel-protecting film 14 and the underlying the silicon semiconductor layer 13 is smaller than the stress created in the prior art thin-film semiconductor device where the field plate electrode FP is formed on the interlayer insulating film. Furthermore, the channel-protecting film 14 itself is less susceptible to polarization. Also, less impurity ions are introduced in the device. Consequently, the effective value of the field plate electrode voltage $V_{FP}$ varies less with time. Hence, the stable transistor characteristics can be maintained for a long time with the field plate electrode voltage $V_{FP}$ set to a low value.

Figure 4:
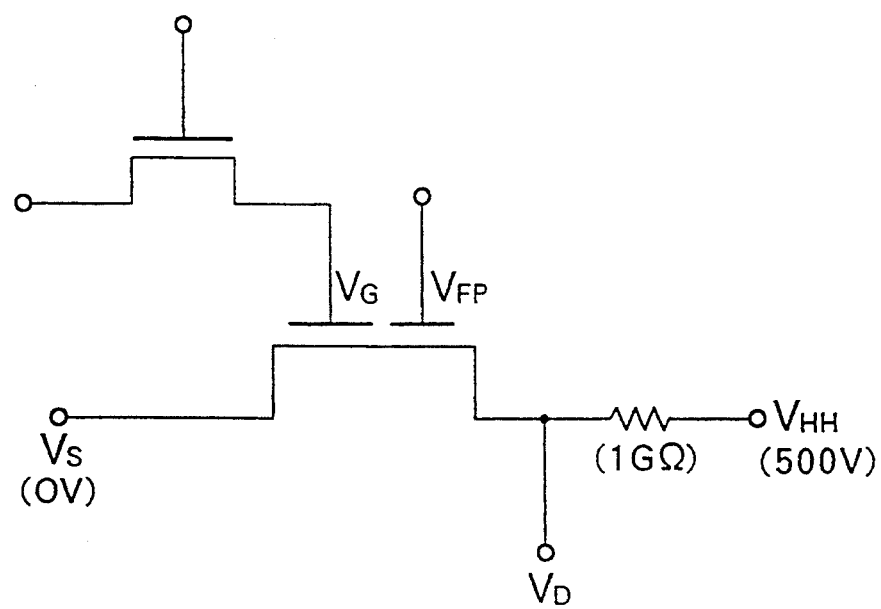
FIG. 4 is a diagram of an inverter circuit incorporating the thin-film semiconductor device shown in FIGS. 2 and 3.

FIG. 4 shows an inverter circuit which is similar in configuration to the prior art inverter circuit except that a thin-film semiconductor device according to the present invention is used.

Figure 5:
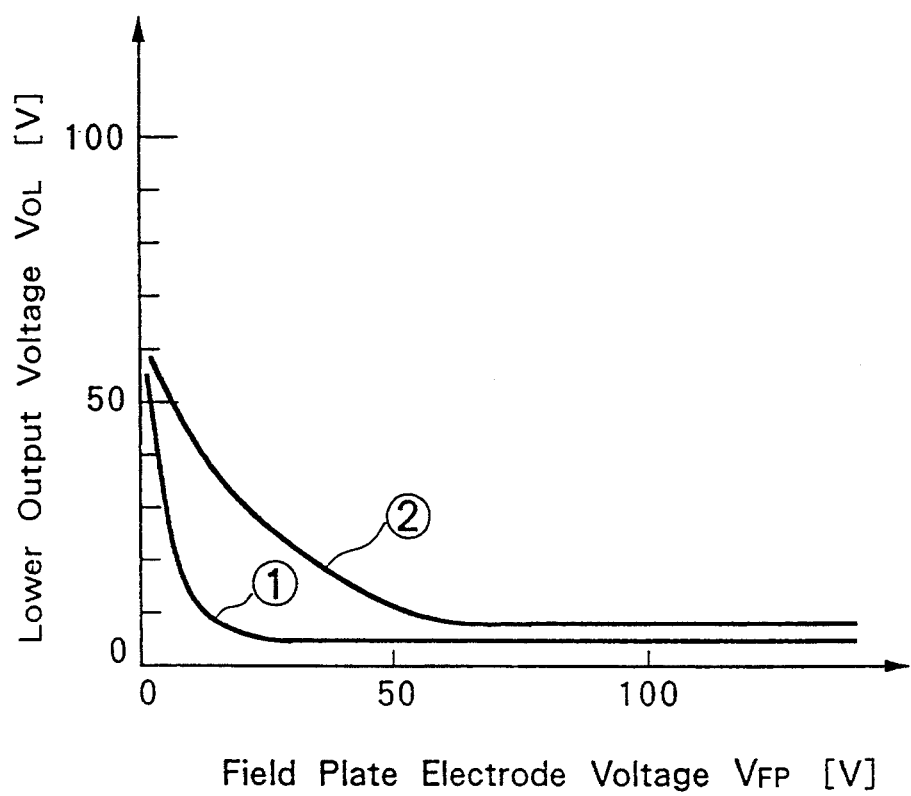
FIG. 5 is a graph showing the relation of the lower output voltage $V_{OL}$ from the inverter circuit shown in FIG. 4 to the field plate electrode voltage $V_{FP}$.

The field plate electrode voltage $V_{FP}$ which provides the lower output voltage $V_{OL}$ of 10 V was measured. As illustrated by curve ① in the graph shown in FIG. 5, low voltages on the order of 10 V suffice. It has been confirmed that the value can be reduced greatly and that the transistor characteristics remain stable for a long period of time.

Figure 6:
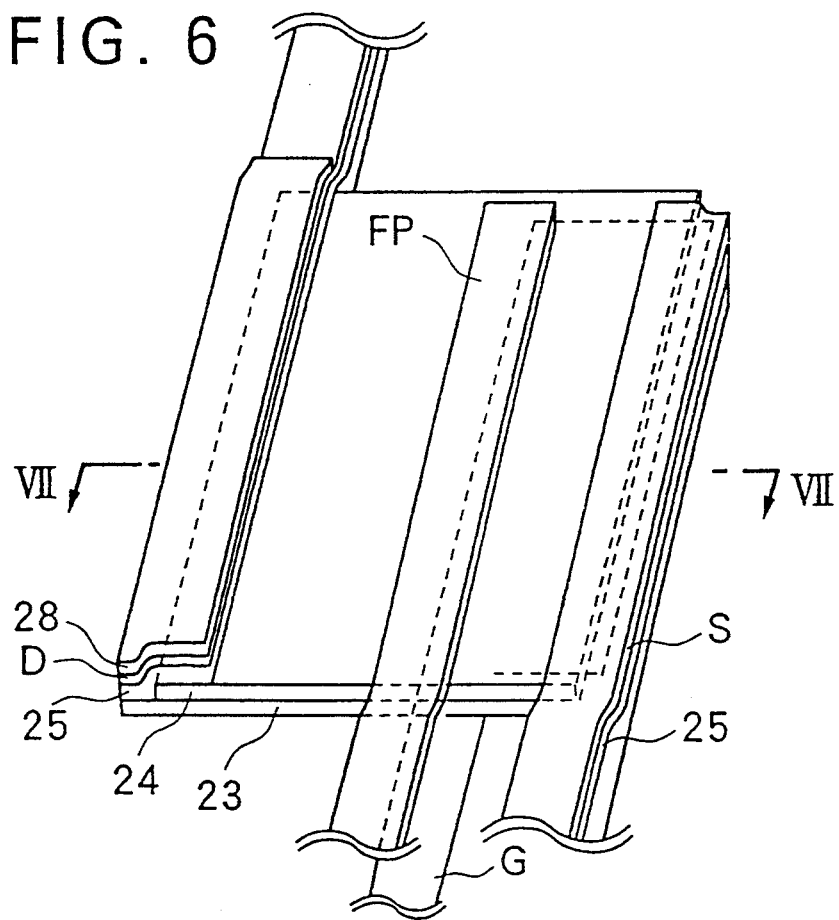
FIG. 6 is a schematic perspective view of a still other thin-film semiconductor device according to the invention.
Figure 7:
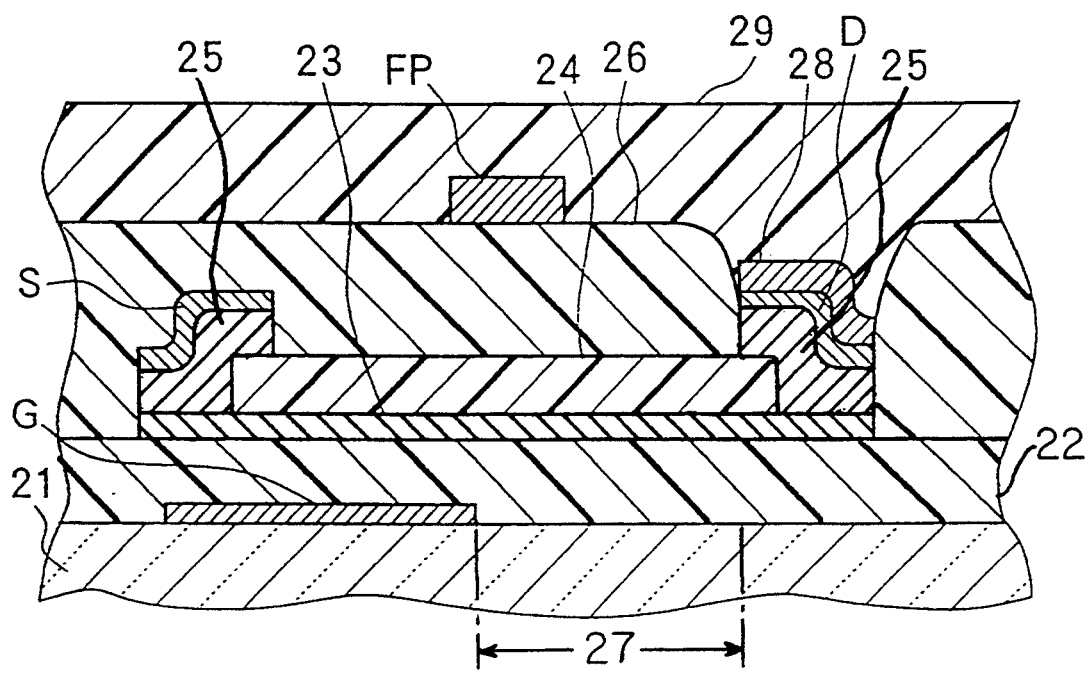
FIG. 7 is a cross-sectional view taken on line VII—VII of FIG. 6.

Referring next to FIGS. 6 and 7, there is shown a still other thin-film semiconductor device according to the invention. This device has a glass substrate 21 on which a gate electrode G made of chromium is formed. This gate electrode G is coated with a gate-insulating film 22 made of $SiN_x$. A silicon semiconductor layer 23 consisting of amorphous silicon is formed on the gate-insulating film 22 and forms an active layer. A channel-protecting film 24 made of $SiN_x$ is formed on the semiconductor layer 23 to protect it. Ohmic contact layers 25 made of $n^+$ amorphous silicon are formed at both ends of the semiconductor layer 23. A source electrode S made of chromium is formed on one of the Ohmic contact layers 25. The gate electrode G is located close to the source electrode S. A drain electrode D also made of chromium is formed on the other Ohmic contact layer 25. An interlayer insulating film 26 consisting of polyimide resin is formed on the channel-protecting layer 24 and on the source electrode S, but not on the drain electrode D. An offset region 27 is formed in the semiconductor layer 23 between the source electrode S and the drain electrode D. A field plate electrode FP made of aluminum is formed on the interlayer insulating film 26 and covers the end of the gate electrode G that is located on the side of the offset region 27. The drain electrode D is coated with a drain-protecting layer 28 made of aluminum. This laminate is totally coated with a device-protecting layer 29 consisting of polyimide resin. Numerous thin-film semiconductor devices of this construction are integrated into a unit with a high device density. The source S and the drain D of each device are brought out. Conductor leads (not shown) made of aluminum are bonded to these brought out portions.

Figure 8:
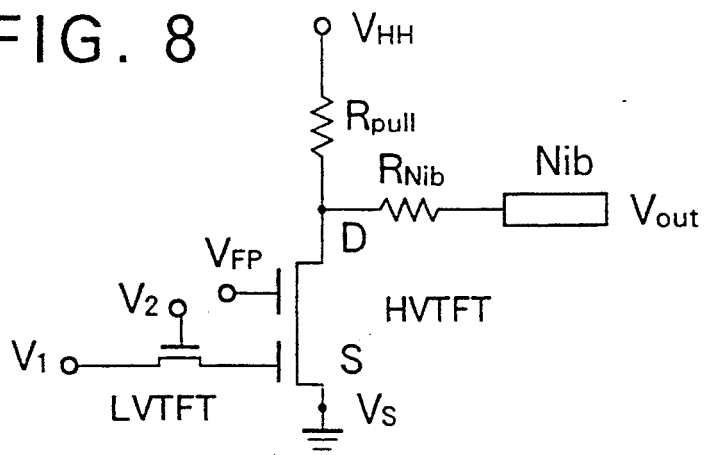
FIG. 8 is an equivalent circuit diagram of a 1-bit unit of a print array for an electrostatic plotter, the printer array being built from thin-film semiconductor devices of the construction shown in FIGS. 6 and 7.
Figure 9:
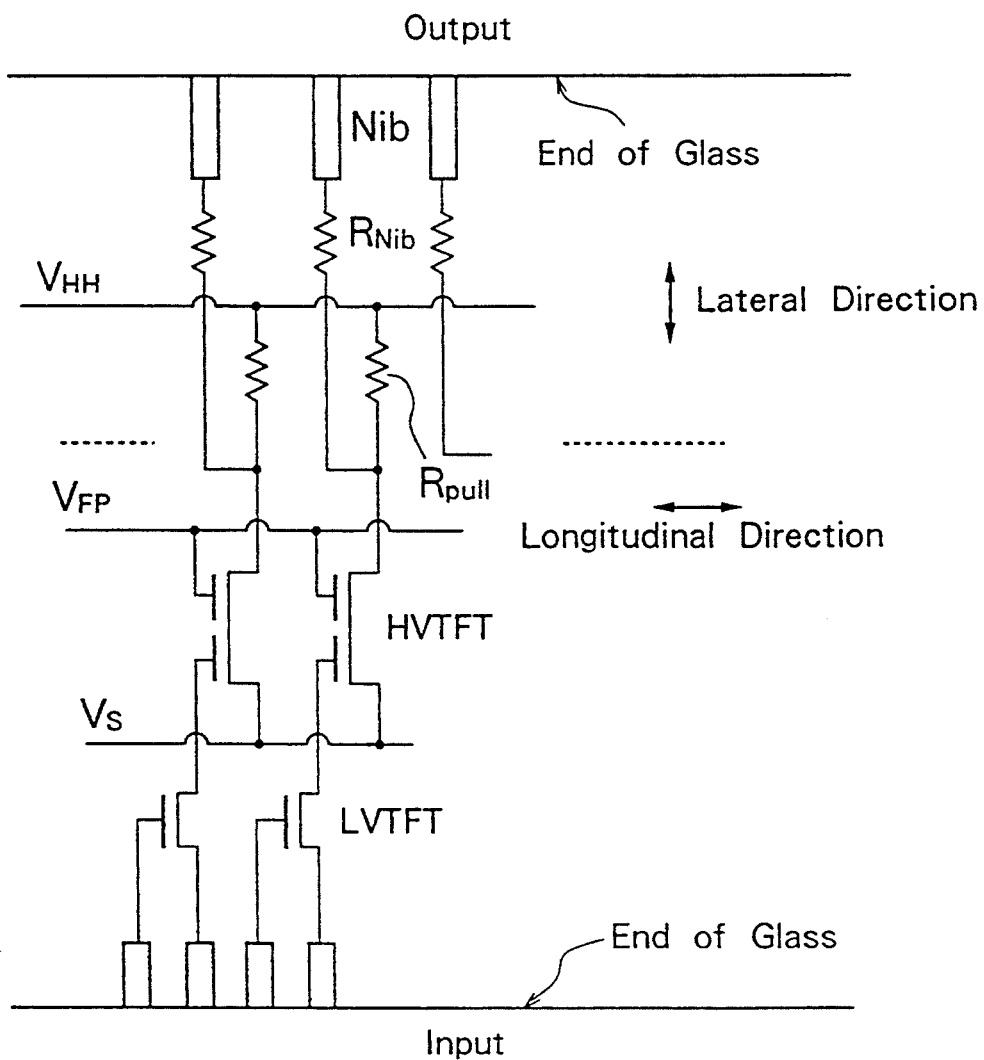
FIG. 9 is an equivalent circuit diagram of the whole of the print array consisting of the unit shown in FIG. 8.

It is possible to fabricate from this integrated unit a print array such as an electrostatic plotter required to deliver a high voltage output. The equivalent circuit of a 1-bit unit of the print array is shown in FIG. 8. The equivalent circuit of the whole print array is shown in FIG. 9.

In FIG. 8, the thin-film semiconductor device withstanding high voltages is indicated by HVTFT. The potential at the gate of this device is driven by a normal low-voltage thin-film semiconductor device LVTFT. A high voltage $V_{HH}$ is applied to the drain electrode D of the device HVTFT via a pull-up resistor $R_{pull}$. Under this condition, if appropriate voltages are superimposed on the gate potential $V_2$ and the source potential $V_1$ of the low-voltage device LVTFT, then the high voltage-withstanding device HVTFT is turned on or off. Concomitantly, the drain voltage takes values between tens of volts to hundreds of volts. This voltage is delivered to a printing electrode Nib via a resistor $R_{Nib}$. As shown in FIG. 9, in an actual print array, the 1-bit unit shown in FIG. 8 is repeated longitudinally of the glass substrate. Resistors such as $R_{Nib}$ and $R_{pull}$ are formed in the $n^+$ amorphous silicon layer. The conductive interconnects interconnecting the input electrodes $V_1$ and $V_2$ and the output electrode Nib are made of aluminum. Furthermore, the conductive leads interconnecting the bias lines $V_{HH}$, $V_{FP}$, $V_S$, and the individual units are made of aluminum.

The method of manufacturing the above-described print array using thin-film semiconductor devices of the construction shown in FIG. 7 is described as follows. First, chromium is sputtered on the glass substrate 21 up to a thickness of, for example, 750 Å, and then patterned to form each gate electrode G. Subsequently, $SiN_x$ is deposited on it up to a thickness of, for example, 3500 Å by plasma chemical vapor deposition to form the gate-insulating film 22. Intrinsic amorphous silicon is deposited up to a thickness of, for example, 500 Å by plasma chemical vapor deposition to form the silicon semiconductor layer 23. $SiN_x$ is deposited up to a thickness of, for example, 1500 Å by plasma chemical vapor deposition to form the channel-protecting film 24. Thereafter, the channel-protecting film 24 is patterned.

A heavily doped $n^+$ amorphous silicon is deposited up to a thickness of, for example, 1000 Å by plasma chemical vapor deposition to form the Ohmic contact layers 25. Chromium is sputtered up to a thickness of, for example, 1500 Å and then patterned. Using this chromium layer as a mask, the underlying $n^+$ amorphous silicon layer and intrinsic amorphous silicon layer are successively etched to form the source electrode S and the drain electrode D. The gate-insulating film 22 is machined to form contact holes in the gate electrode G, for the metal interconnects.

Then, the interlayer insulating film 26 having a thickness of 1.5 μm is fabricated from polyimide and patterned. At this time, an opening is formed also in the drain electrode D. Aluminum is sputtered up to a thickness of 1.5 μm and patterned to form the field plate electrode FP and the drain-protecting layer 28 on the drain electrode D. Finally, the whole device is coated with the device-protecting layer 29 consisting of polyimide resin and having a thickness of, for example, 3 μm. During this manufacturing process, the input electrodes, the output electrodes, the voltage lines, and the conductive interconnects are formed from aluminum simultaneously. The resistors are formed simultaneously from the n+ amorphous silicon layer.

Figure 10:
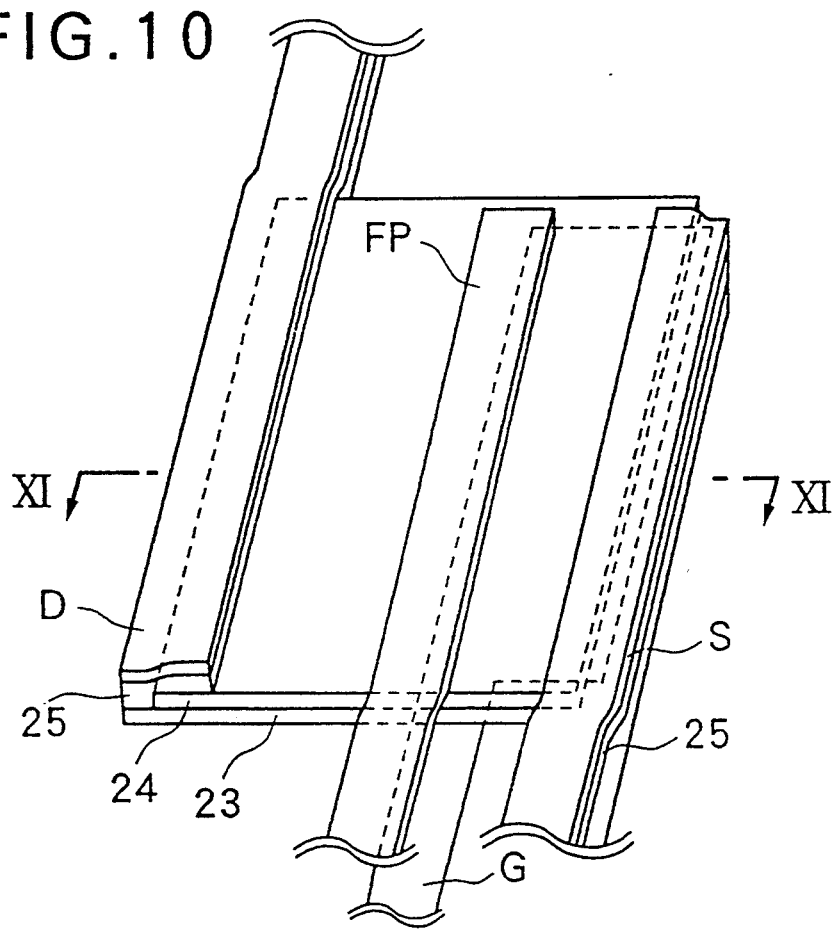
FIG. 10 is a schematic perspective view of a comparative example of a thin-film semiconductor device.
Figure 11:
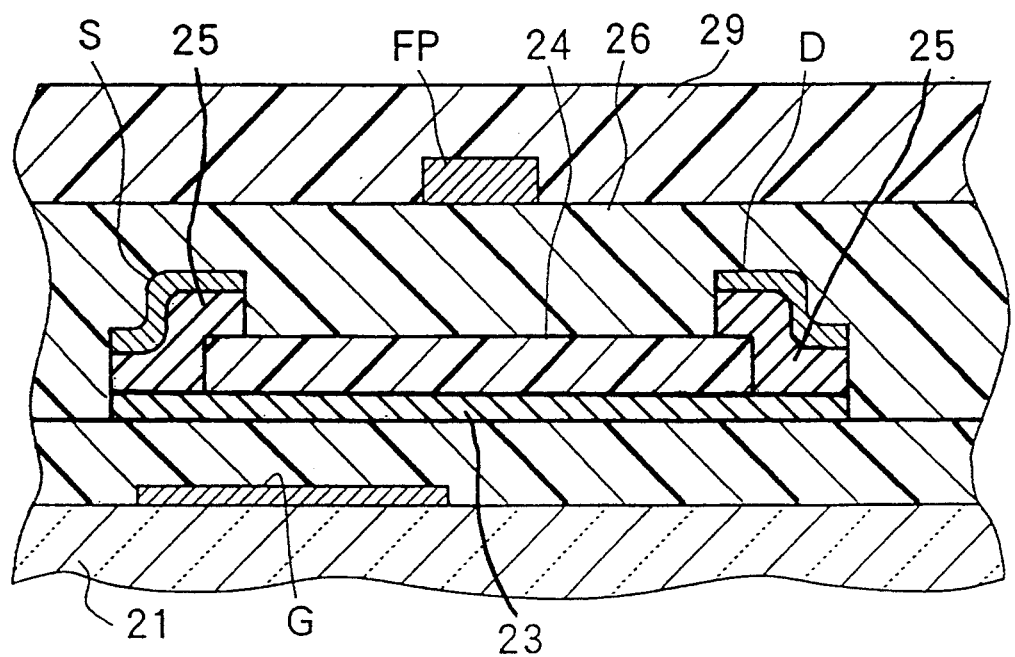
FIG. 11 is a cross-sectional view taken on line XI—XI of FIG. 10.
Figure 12:
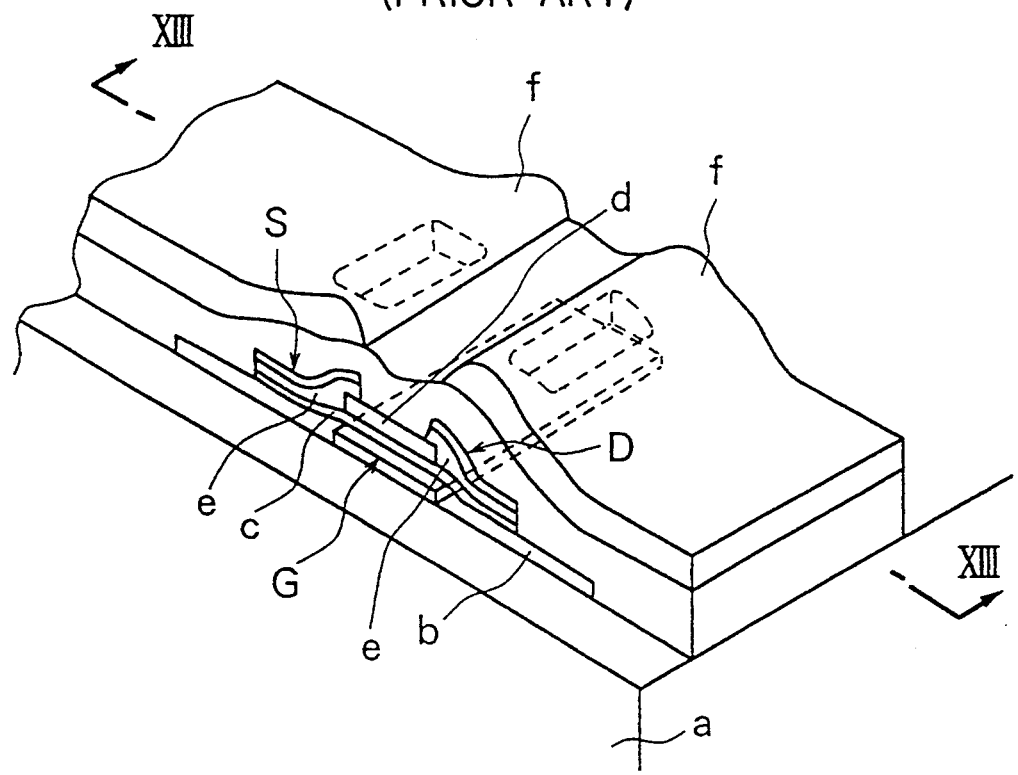
FIG. 12 is a perspective view of a conventional thin-film semiconductor device.
Figure 13:
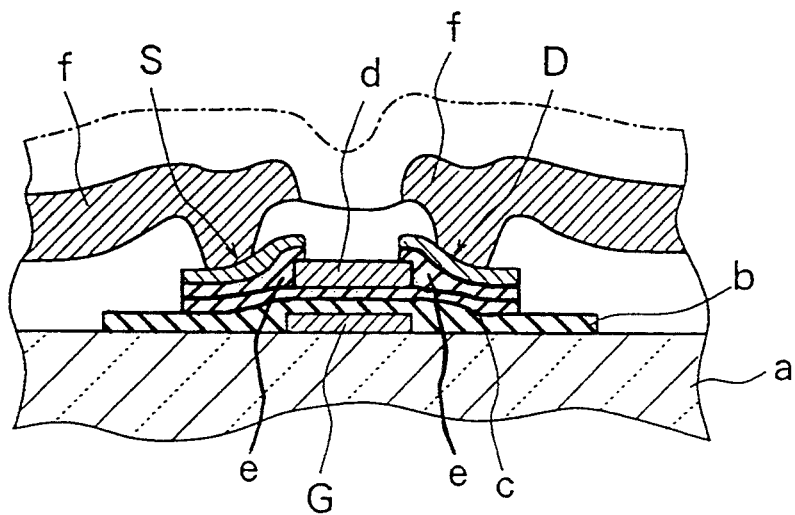
FIG. 13 is a cross-sectional view taken on line XIII—XIII of FIG. 12.
Figure 14:
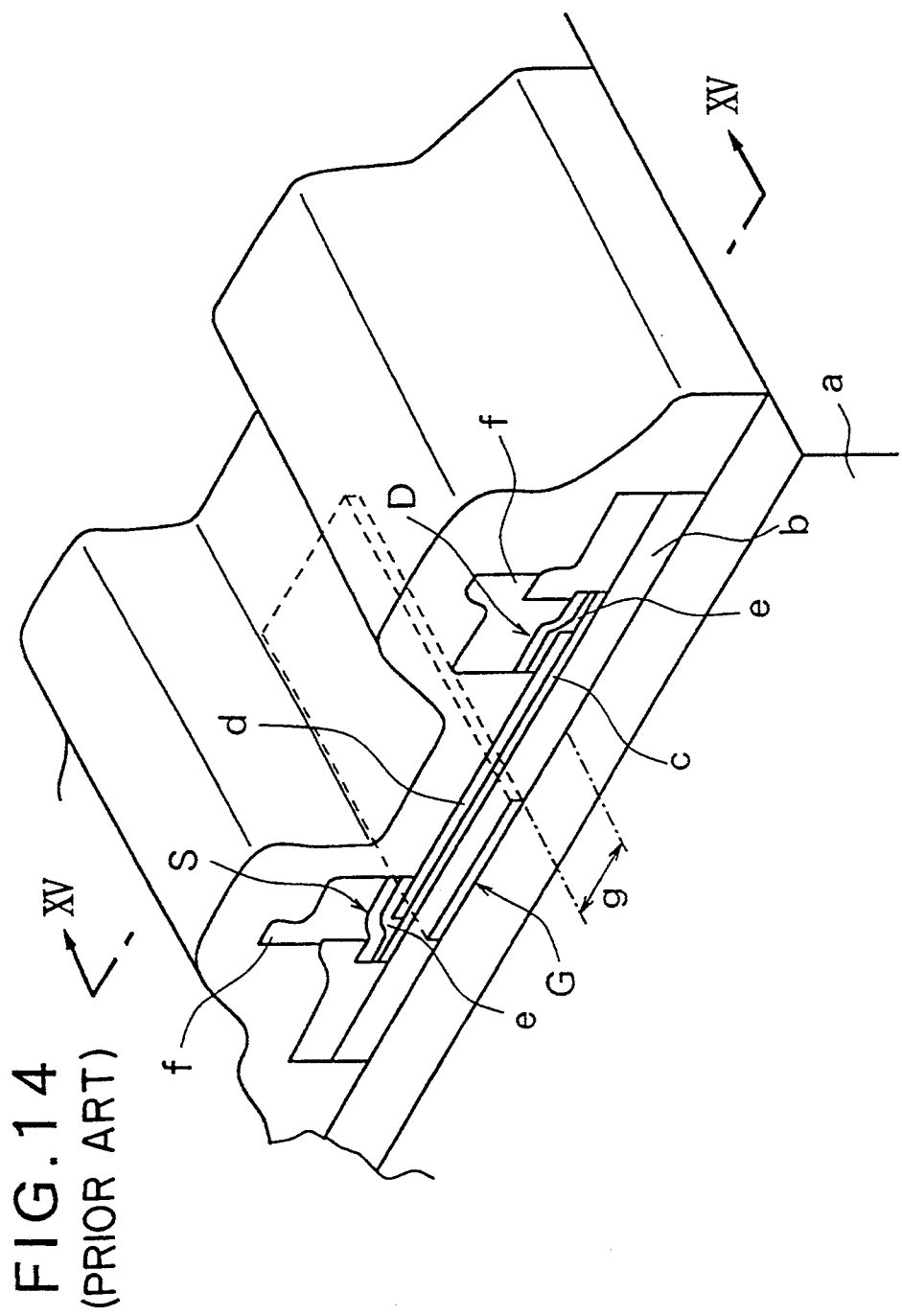
FIG. 14 is a perspective view of a known thin-film semiconductor device having an offset region.
Figure 15:
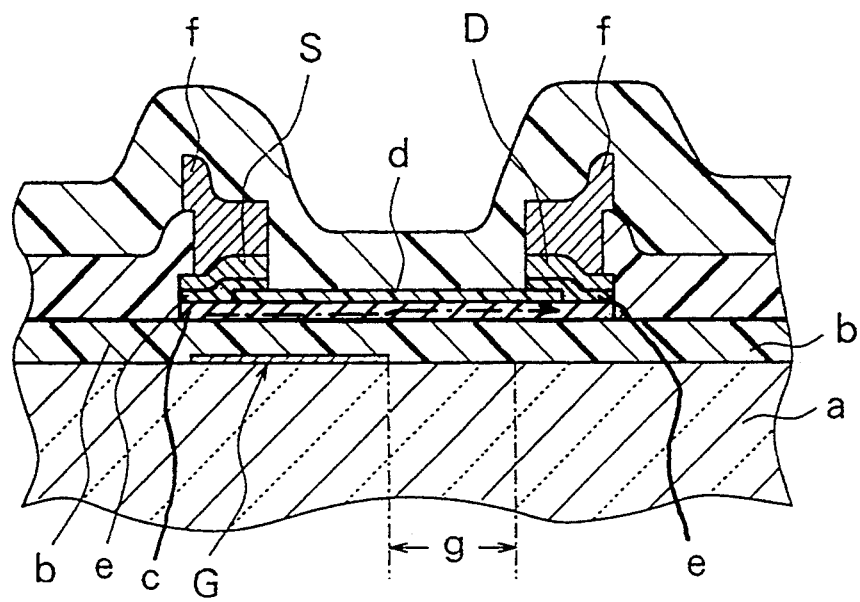
FIG. 15 is a cross-sectional view taken on line XV—XV of FIG. 14.
Figure 16:
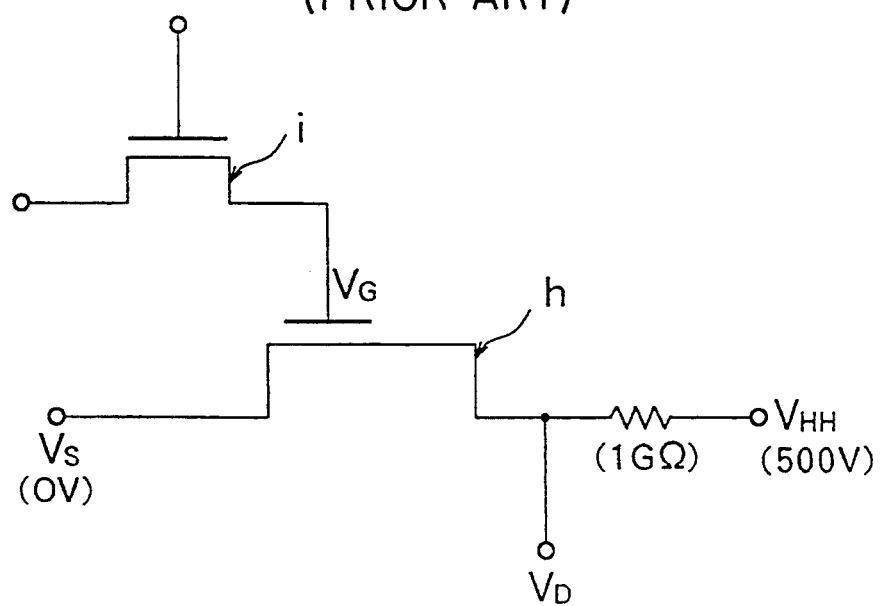
FIG. 16 is a diagram of an inverter circuit incorporating the known thin-film semiconductor device shown in FIGS. 14 and 15.
Figure 17:
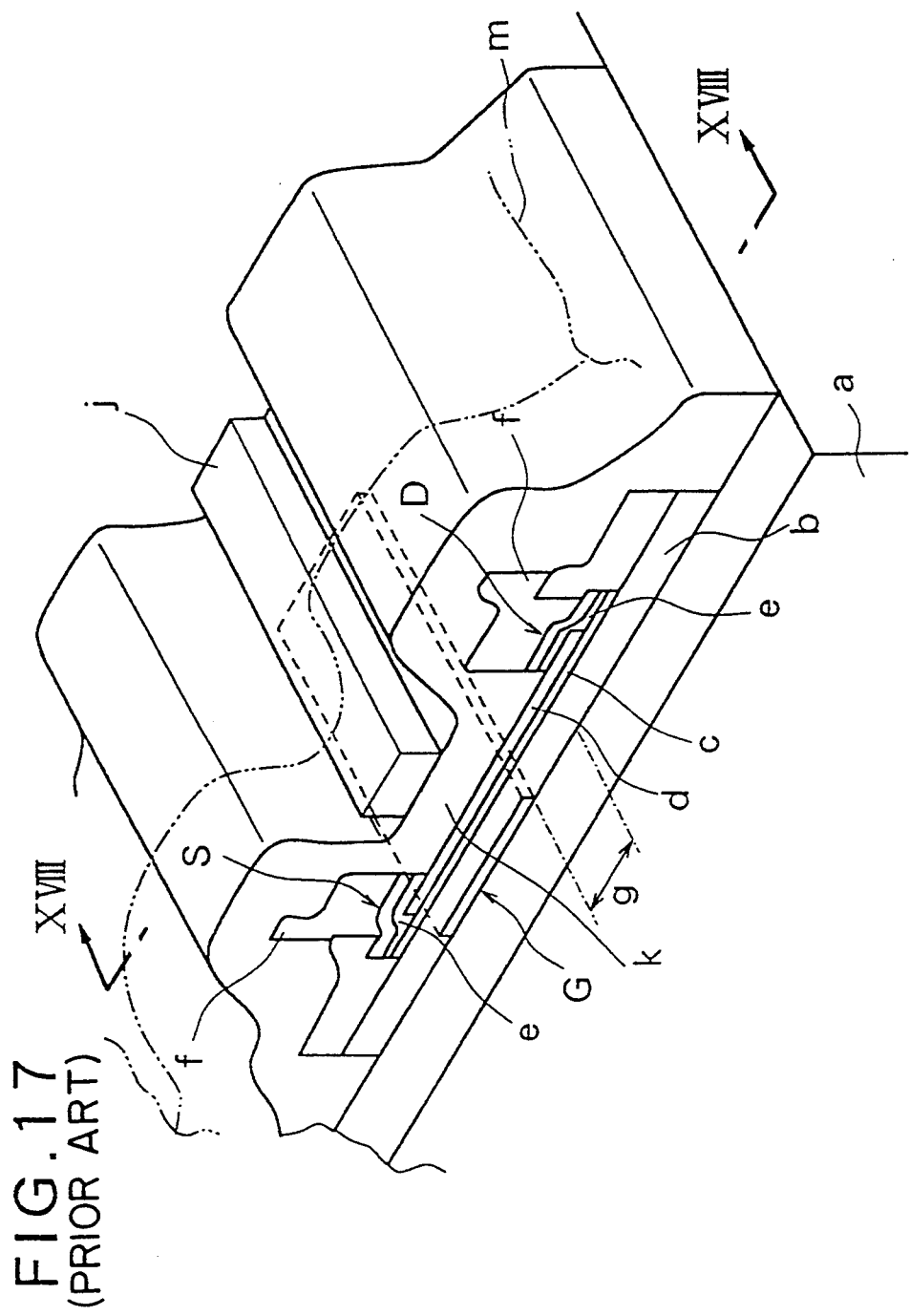
FIG. 17 is a perspective view of a known thin-film semiconductor device having a field plate electrode.
Figure 18:
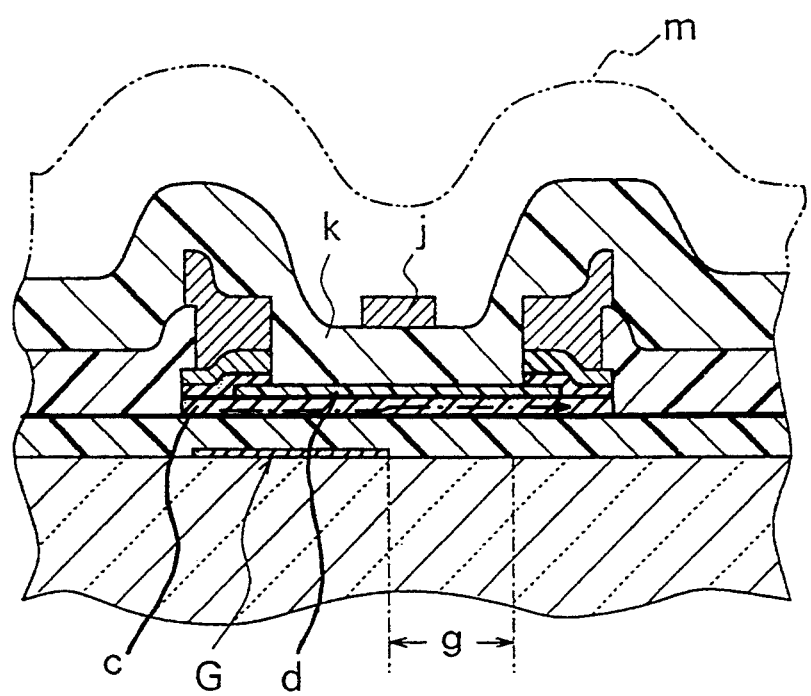
FIG. 18 is a cross-sectional view taken on line XVIII—XVIII of FIG. 17.

FIGS. 10 and 11 show a comparative example which is similar to the above example described in connection with FIGS. 6 and 7 except that the drain-protecting layer 28 is not formed. To check the performance of the thin-film semiconductor device of the above example of the invention, print arrays were fabricated, using the above example and the comparative example, respectively. These arrays were operated for a long time (70 days) under the conditions: $V_{HH}=450$ V, $V_{FP}=100$ V, $V_s=0$ V. It was observed that the drain electrode D of the comparative conventional example corroded. However, the drain electrode D of the above example of the present invention did not corrode at all. It was also confirmed that the good characteristics of the array were maintained.

In the above example of the invention, a protective layer of aluminum was not formed on the portion brought out from the drain electrode D. However, it was noticed that this portion did not corrode at all. Also in the above example, the drain-protecting layer 28 and the field plate electrode FP were formed simultaneously out of aluminum. If an increase in the number of manufacturing steps is permitted, the interlayer insulating film 26 is formed after the formation of the drain-protecting layer 28. Then, the field plate electrode FP can also be fabricated from aluminum. Also in the above example, if the field plate electrode FP is placed directly on the channel-protecting film 24 in the same way as in the example already described in conjunction with FIGS. 2 and 3, then the example shown in FIGS. 6 and 7 can yield the same advantages as those offered by the example shown in FIGS. 2 and 3.

What is claimed is:

1. A thin-film semiconductor device comprising:
   an insulating substrate;
   a gate electrode having first and second ends on the substrate;
   a gate-insulating film overlaying the gate electrode;
   a semiconductor layer on the gate-insulating film having a first portion overlaying the gate electrode and a second portion;
   an inorganic channel-protecting film overlaying the semiconductor layer;
   a source electrode connected with the first portion of the semiconductor layer and overlaying the first end of the gate electrode;
   a drain electrode connected with the second portion of the semiconductor layer, wherein the gate electrode is disposed closer to the source electrode than to the drain electrode;
   an offset region in the semiconductor layer between the drain electrode and the second end of the gate electrode;
   a field plate electrode adapted to produce an electric field, the field plate electrode being directly disposed on the channel-protecting film and overlaying the second end of the gate electrode; and
   an organic interlayer insulating film overlaying the channel-protecting film and the field plate electrode.

2. The thin-film semiconductor device according to claim 1, wherein the channel-protecting film is comprised of silicon nitride.

3. The thin-film semiconductor device according to claim 1, wherein the interlayer insulating film is comprised of polyimide resin.

* * * * *